(12) United States Patent
Cernea et al.

(10) Patent No.: US 7,170,802 B2
(45) Date of Patent: Jan. 30, 2007

(54) FLEXIBLE AND AREA EFFICIENT COLUMN REDUNDANCY FOR NON-VOLATILE MEMORIES

(75) Inventors: Raul-Adrian Cernea, Santa Clara, CA (US); Yan Li, Milpitas, CA (US)

(73) Assignee: SanDisk Corporation, Milpitas, CA (US)

( * ) Notice: Subject to any disclaimer, the term of this patent is extended or adjusted under 35 U.S.C. 154(b) by 597 days.

(21) Appl. No.: 10/751,097

(22) Filed: Dec. 31, 2003

(65) Prior Publication Data

US 2005/0141387 A1 Jun. 30, 2005

(51) Int. Cl.
*G11C 29/00* (2006.01)

(52) U.S. Cl. ............ 365/200; 365/185.09; 365/185.17; 365/185.33; 365/189.05; 365/189.12

(58) Field of Classification Search ................ 365/200, 365/185.09, 185.33, 185.17, 189.05, 189.12
See application file for complete search history.

(56) References Cited

U.S. PATENT DOCUMENTS

| | | | |
|---|---|---|---|
| 3,710,348 A | 1/1973 | Craft | |
| 3,895,360 A | 7/1975 | Cricchi et al. | |
| 4,720,815 A | 1/1988 | Ogawa | |
| 4,757,477 A | 7/1988 | Nagayama et al. | |
| 5,095,344 A | 3/1992 | Harari | |
| 5,172,338 A | 12/1992 | Mehrotra et al. | |
| 5,200,959 A | 4/1993 | Gross et al. | |
| 5,270,979 A | 12/1993 | Harari et al. | |
| 5,315,541 A | 5/1994 | Harari et al. | |
| 5,380,672 A | 1/1995 | Yuan et al. | |
| 5,386,390 A | 1/1995 | Okitaka | |
| 5,428,621 A | 6/1995 | Mehrotra et al. | |
| 5,430,679 A | 7/1995 | Hiltebeitel et al. | |
| 5,430,859 A | 7/1995 | Norman et al. | |
| 5,442,748 A | 8/1995 | Chang et al. | |
| 5,479,370 A | 12/1995 | Furuyama et al. | |
| 5,602,987 A | 2/1997 | Harari et al. | |
| 5,642,312 A | 6/1997 | Harari | |
| 5,657,332 A | 8/1997 | Auclair et al. | |
| 5,663,901 A | 9/1997 | Wallace et al. | |
| 5,712,180 A | 1/1998 | Guterman et al. | |
| 5,783,958 A | 7/1998 | Lysinger | |
| 5,890,192 A | 3/1999 | Lee et al. | |
| 6,038,184 A | 3/2000 | Naritake | |
| 6,091,666 A | 7/2000 | Arase et al. | |
| 6,151,248 A | 11/2000 | Harari et al. | |
| 6,222,762 B1 | 4/2001 | Guterman et al. | |

(Continued)

FOREIGN PATENT DOCUMENTS

JP 61292747 A 12/1986

(Continued)

OTHER PUBLICATIONS

International Search Report and Written Opinion for PCT/US2004/042990, mailed May 3, 2005. (13 pages).

*Primary Examiner*—Richard Elms
*Assistant Examiner*—Pho M. Luu
(74) *Attorney, Agent, or Firm*—Parsons Hsue & de Runtz LLP

(57) ABSTRACT

A non-volatile memory wherein bad columns in the array of memory cells can be removed. Substitute redundant columns can replace the removed columns. Both of these processes are performed on the memory in a manner that is externally transparent and, consequently, need not be managed externally by the host or controller to which the memory is attached. The bad column can be maintained on the memory. At power up, the list of bad columns is used to fuse out the bad columns. The memory may also contain a number of redundant columns that can be used to replace the bad columns.

26 Claims, 13 Drawing Sheets

U.S. PATENT DOCUMENTS

| | | |
|---|---|---|
| 6,230,233 B1 | 5/2001 | Lofgren et al. |
| 6,252,800 B1 | 6/2001 | Chida |
| 6,426,893 B1 | 7/2002 | Conley et al. |
| 6,480,423 B2 | 11/2002 | Toda et al. |
| 6,512,263 B1 | 1/2003 | Yuan et al. |
| 6,522,580 B2 | 2/2003 | Chen et al. |
| 6,560,146 B2 | 5/2003 | Cernea |
| 6,771,536 B2 | 8/2004 | Li et al. |
| 6,813,184 B2 * | 11/2004 | Lee ........................ 365/185.09 |
| 2003/0016182 A1 | 1/2003 | Lohr |
| 2003/0223274 A1 * | 12/2003 | Cernea ................. 365/189.05 |
| 2004/0057288 A1 | 3/2004 | Cernea |
| 2004/0060031 A1 | 3/2004 | Cernea |
| 2004/0109357 A1 | 6/2004 | Cernea et al. |

FOREIGN PATENT DOCUMENTS

| | | |
|---|---|---|
| JP | 01128297 | 5/1989 |
| JP | 06150666 A | 5/1994 |
| WO | 03/025939 A2 | 3/2003 |

* cited by examiner

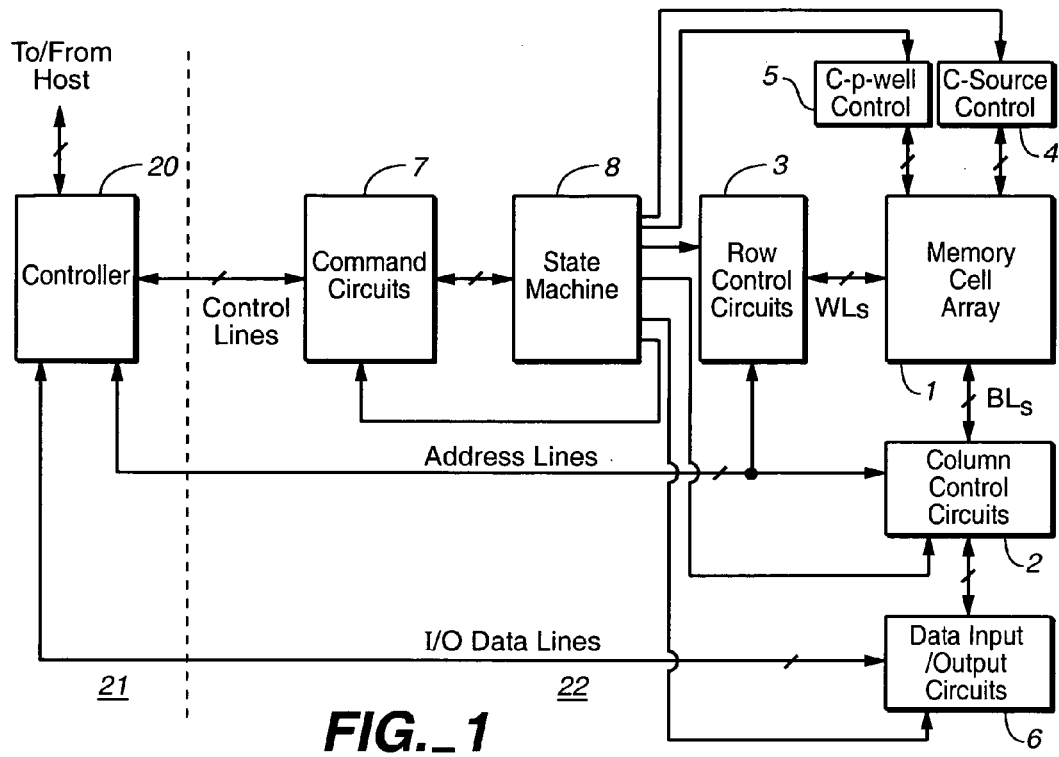
FIG._1
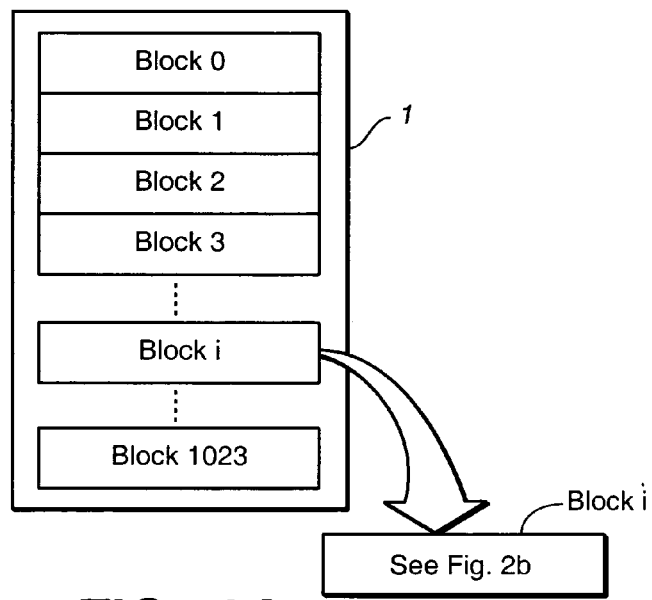
FIG._2A

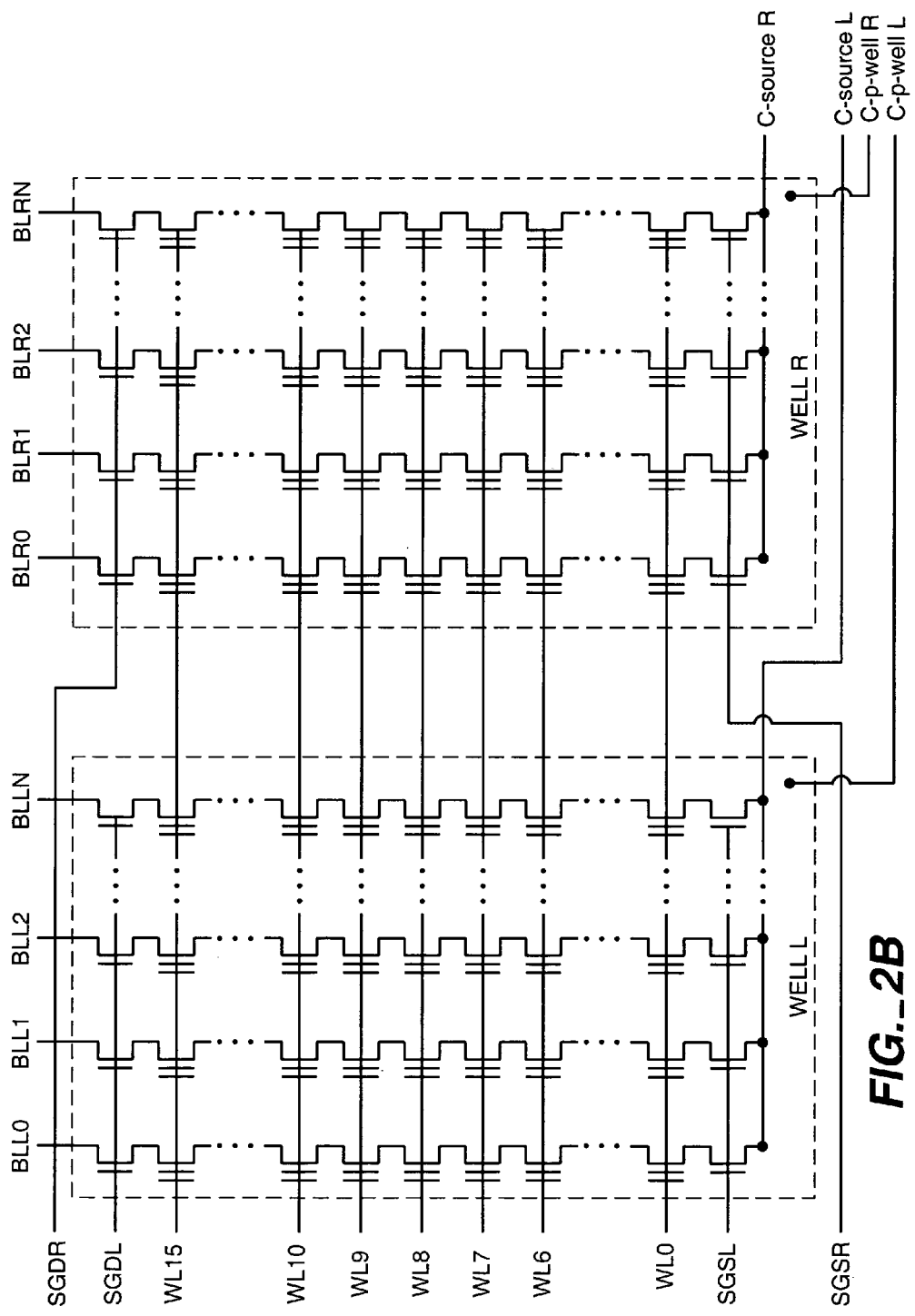
FIG._2B

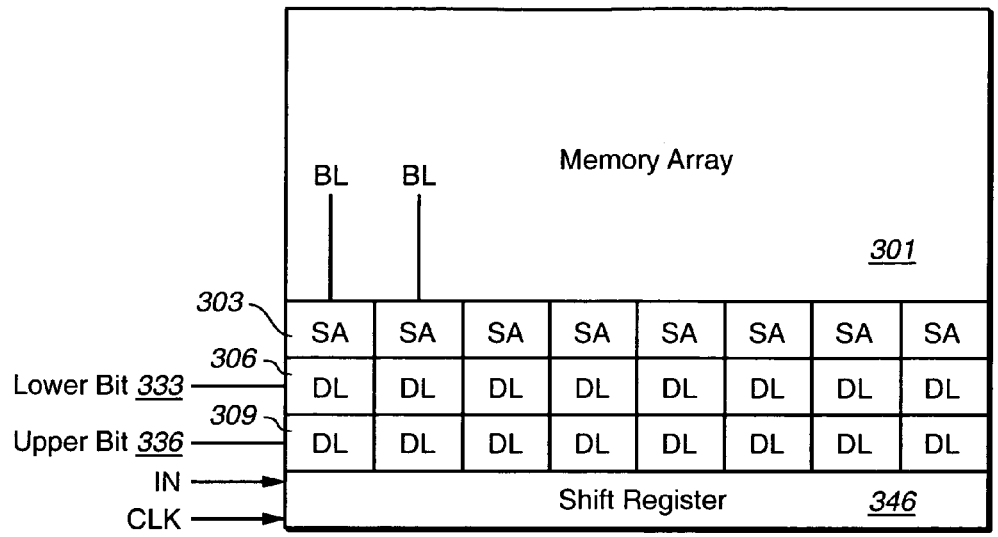
FIG._3A
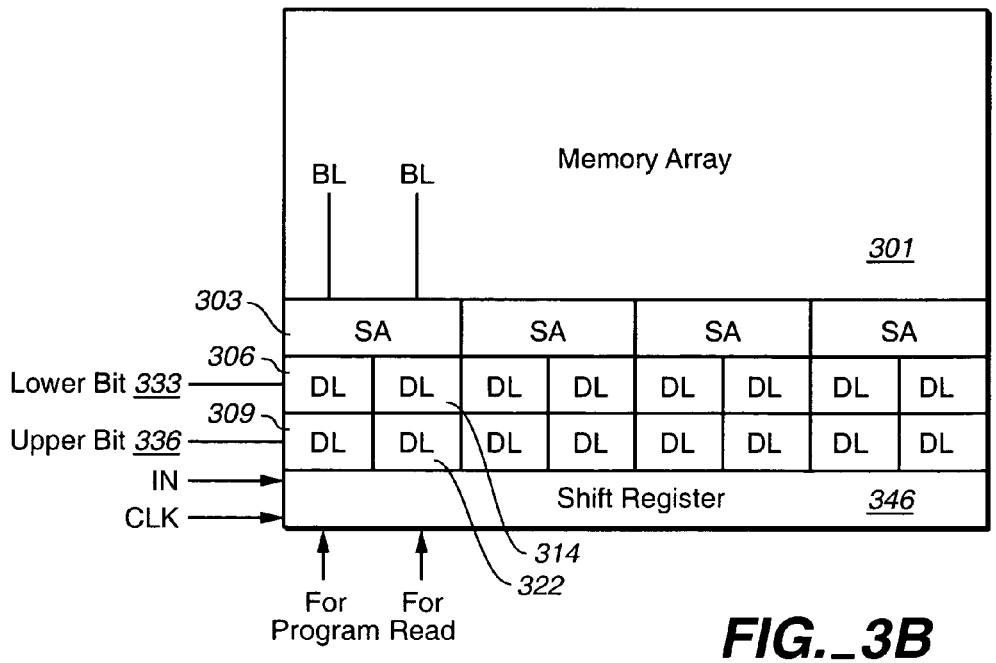
FIG._3B

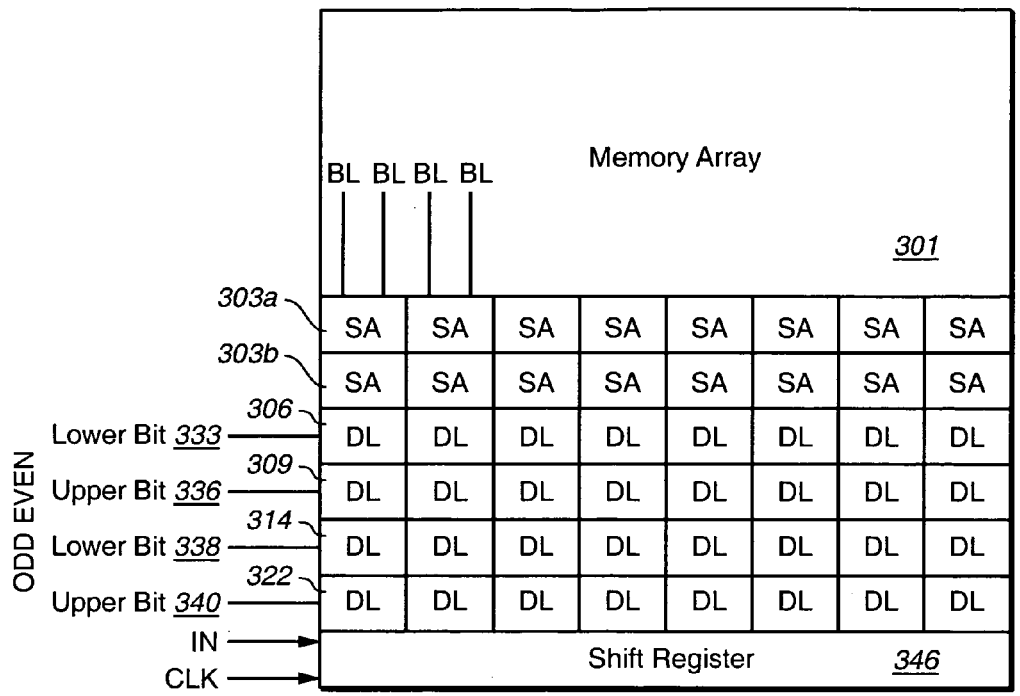
FIG._3C
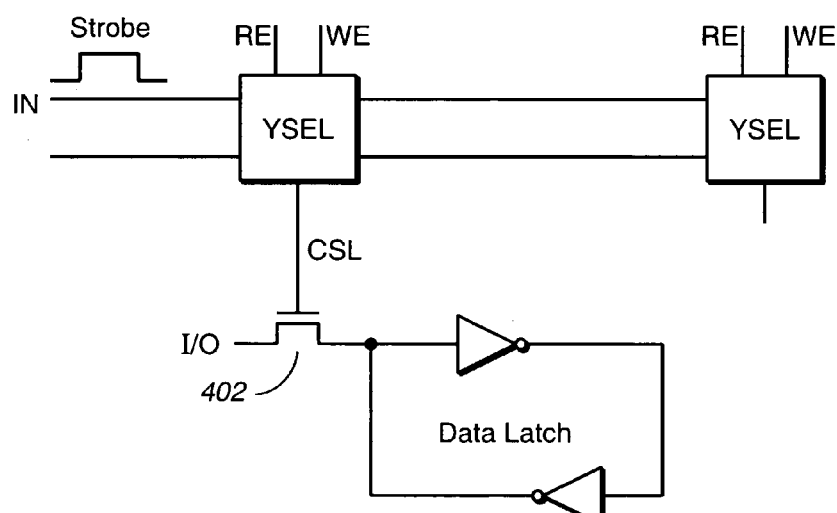
FIG._4

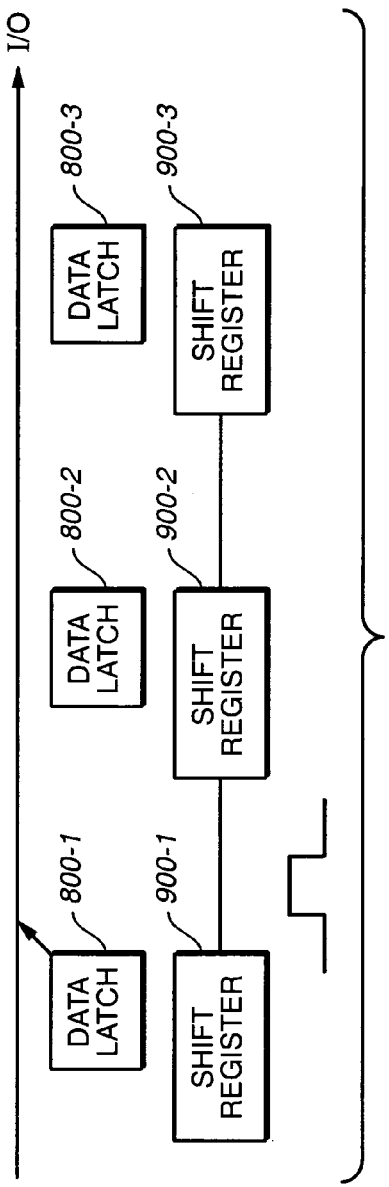
FIG._5
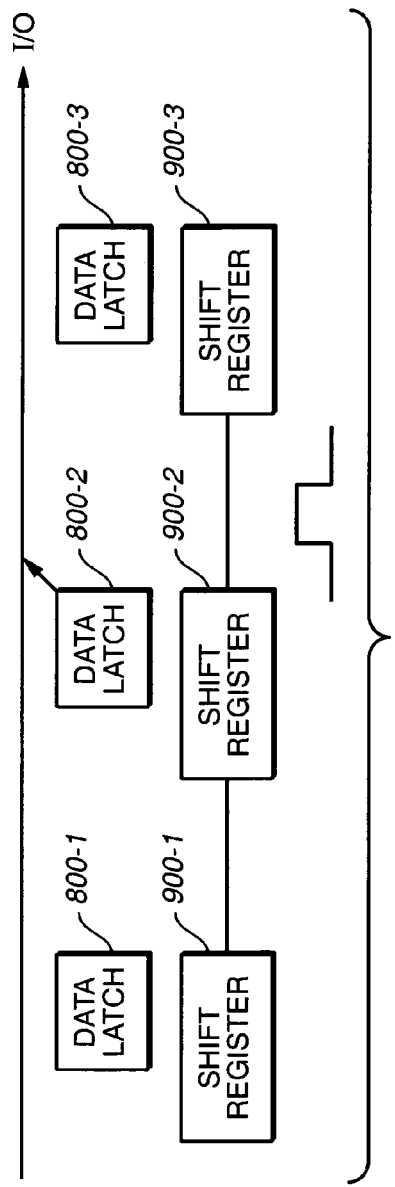
FIG._6

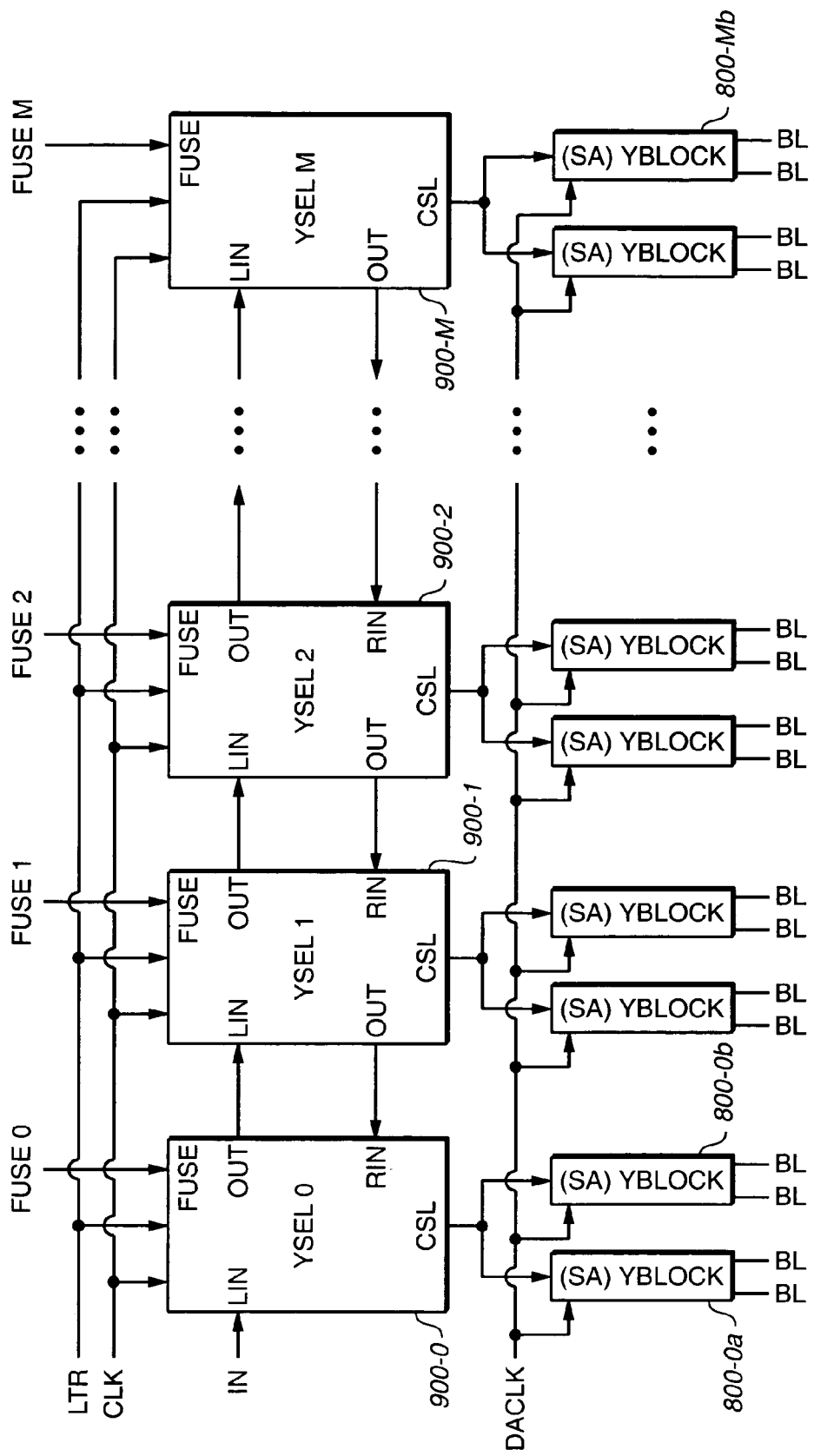
FIG._7A

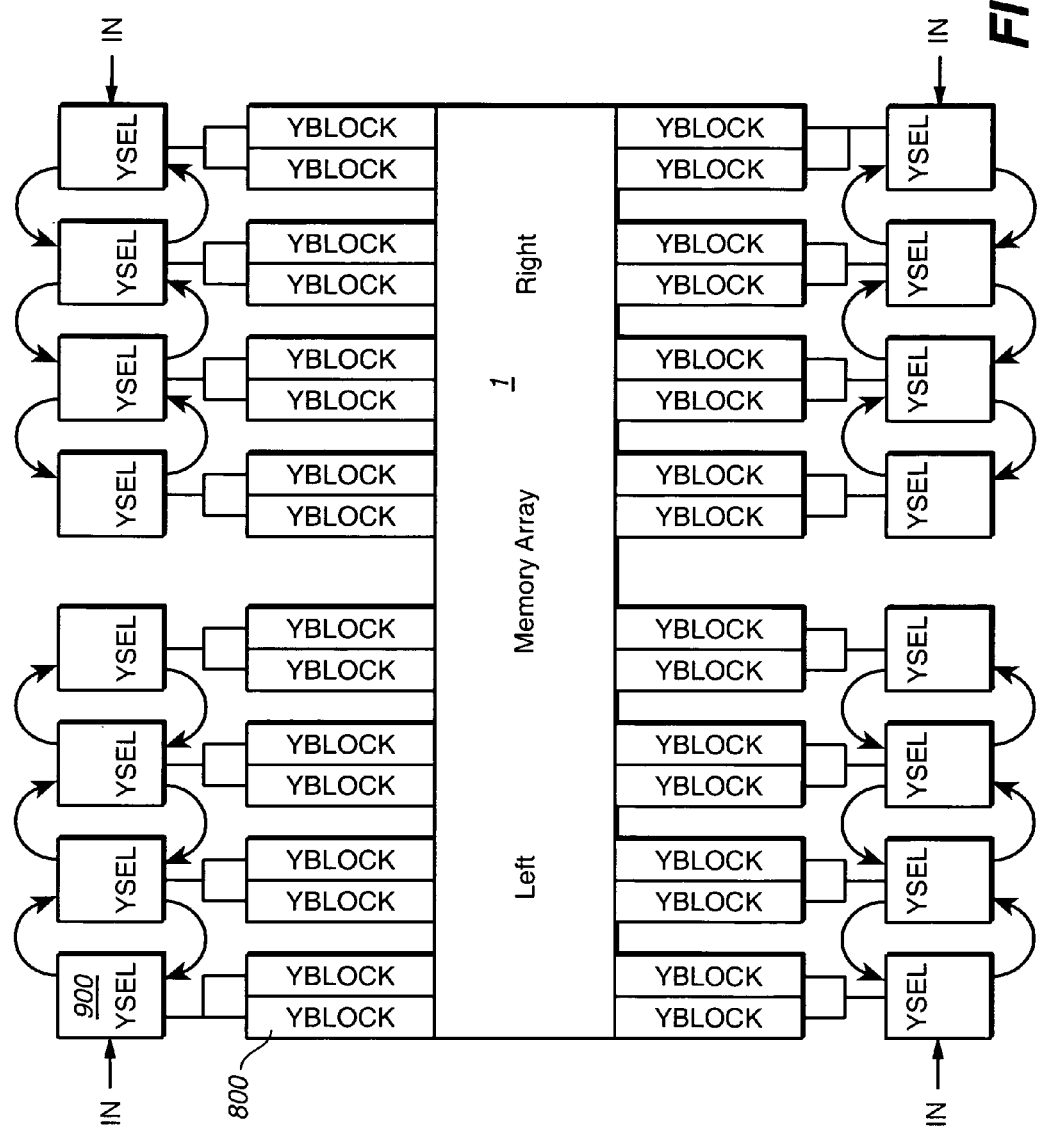
FIG._7B

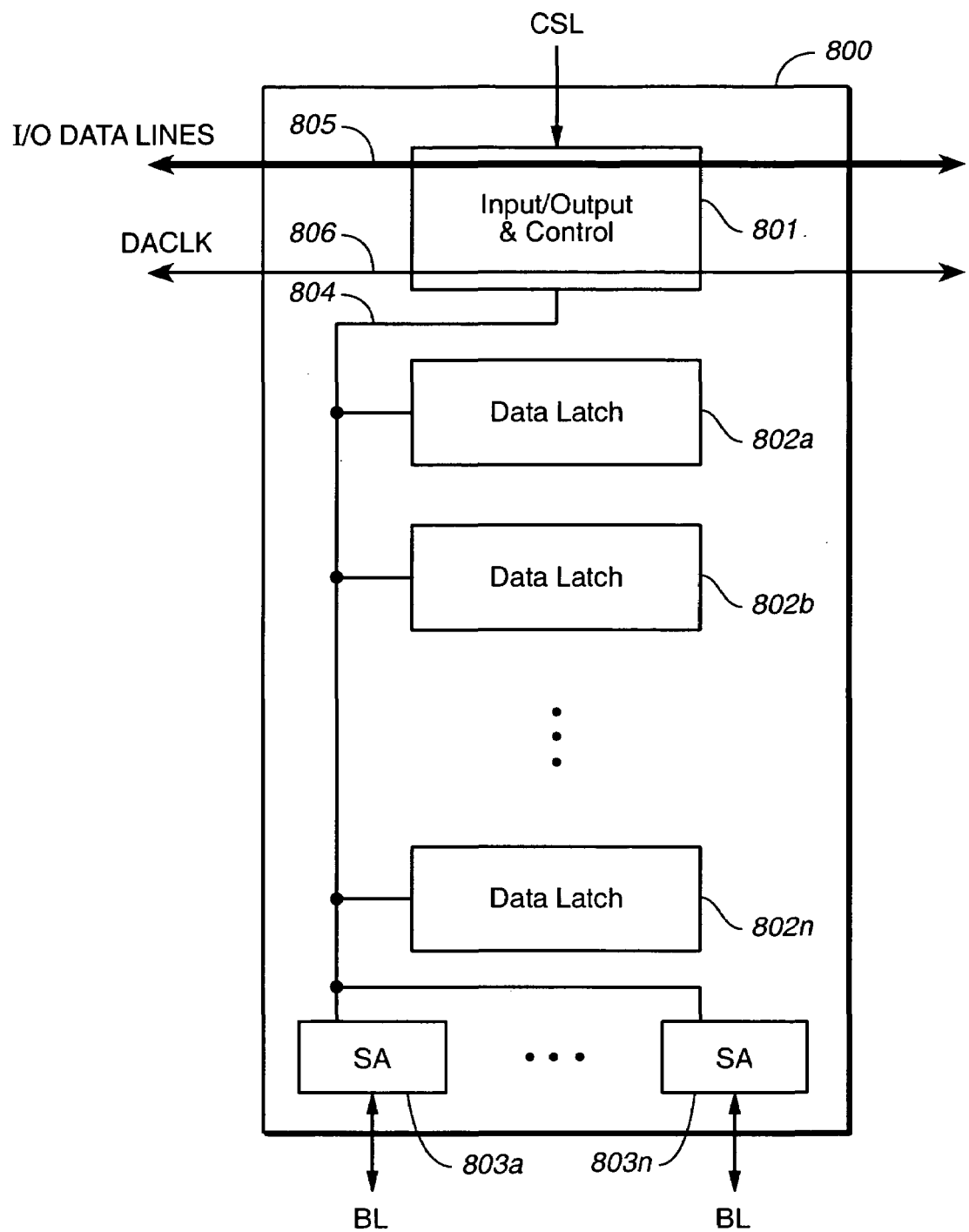
FIG._8

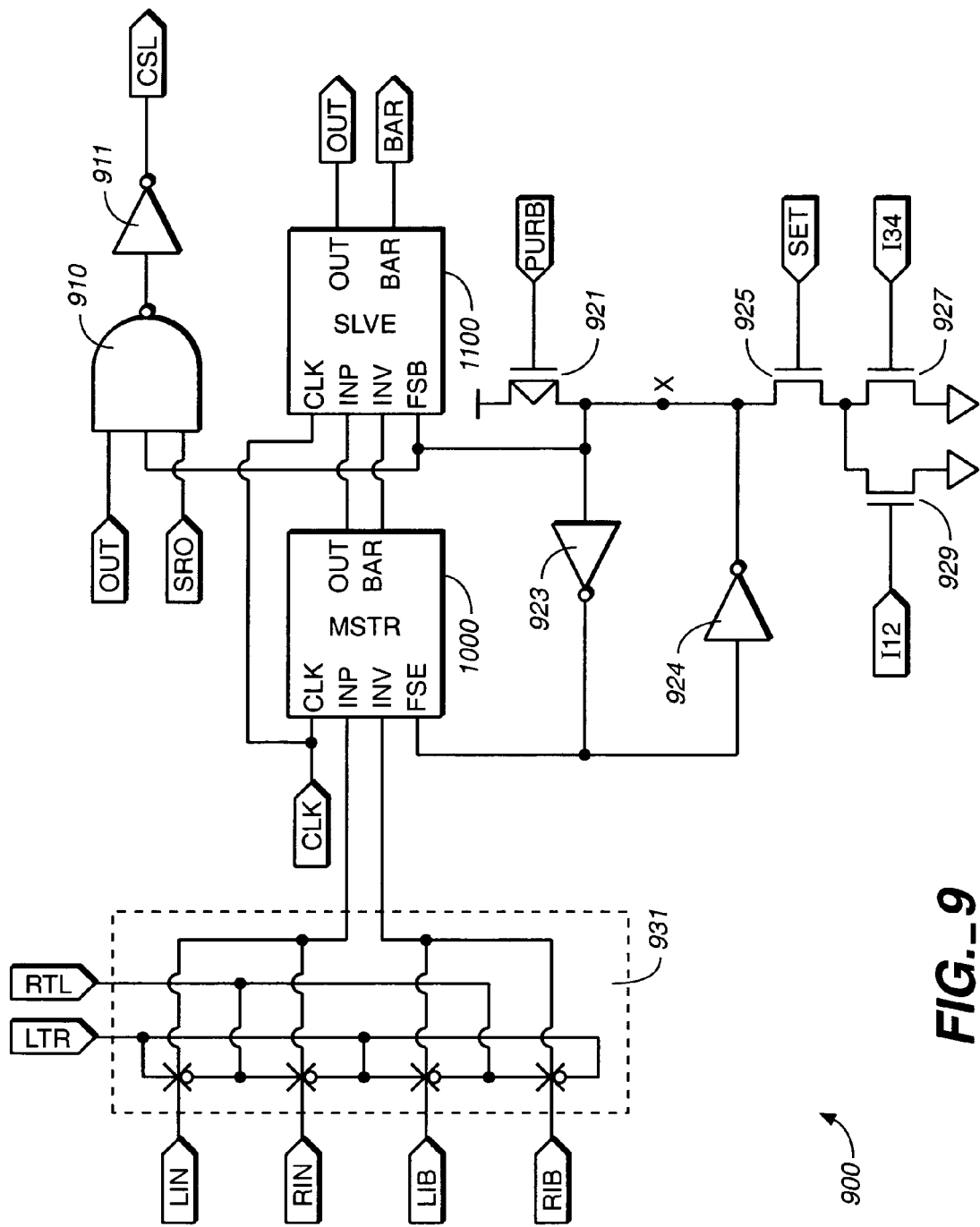
FIG._9

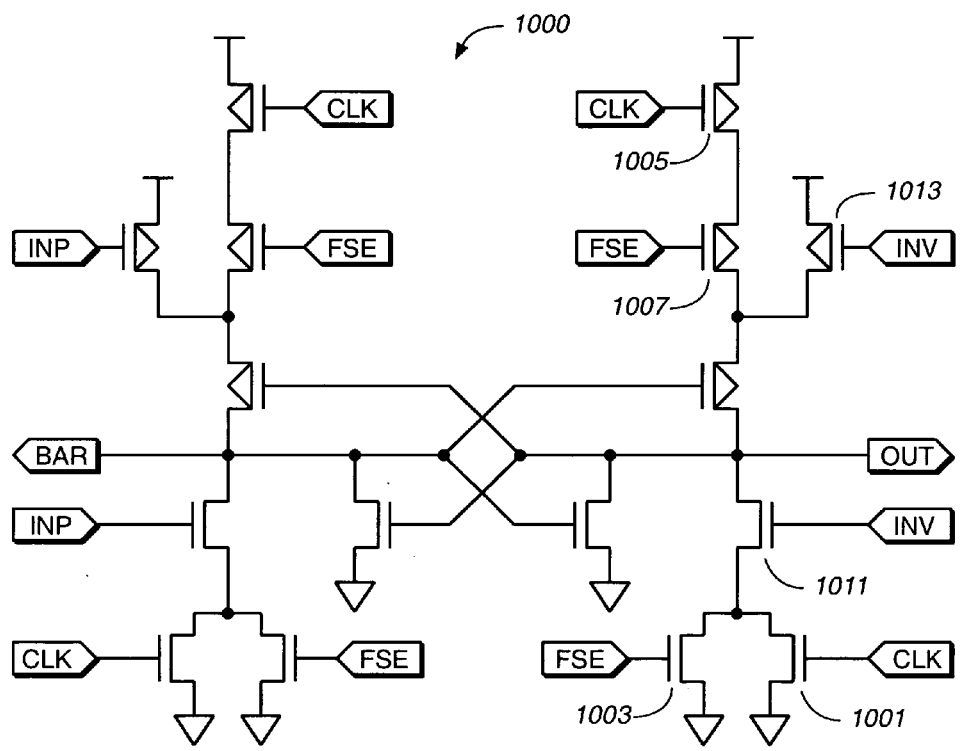
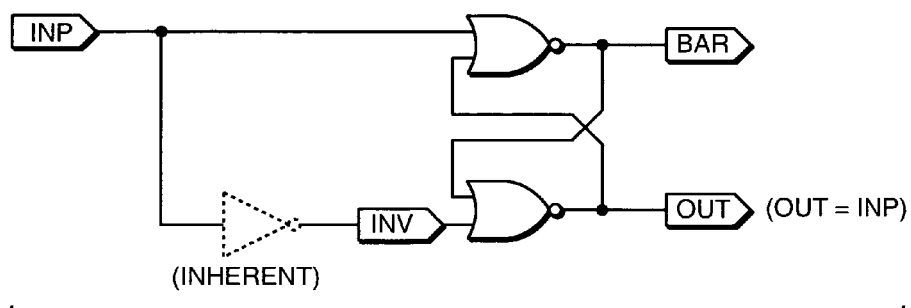
FIG._10

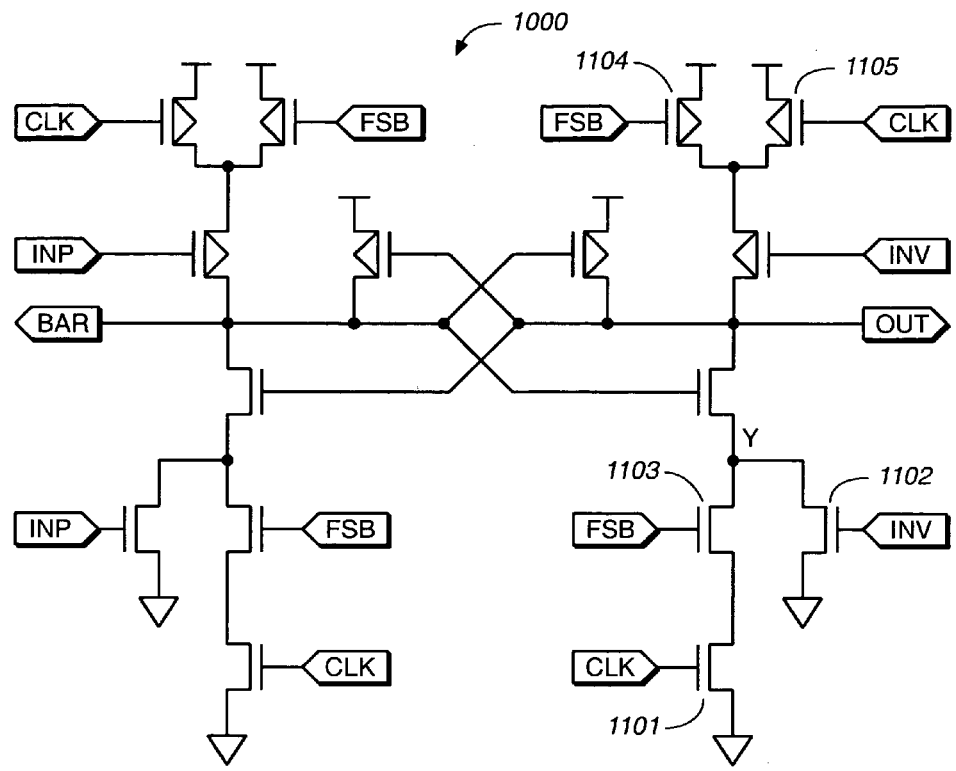
When FSE = 1 (FSB = 0):
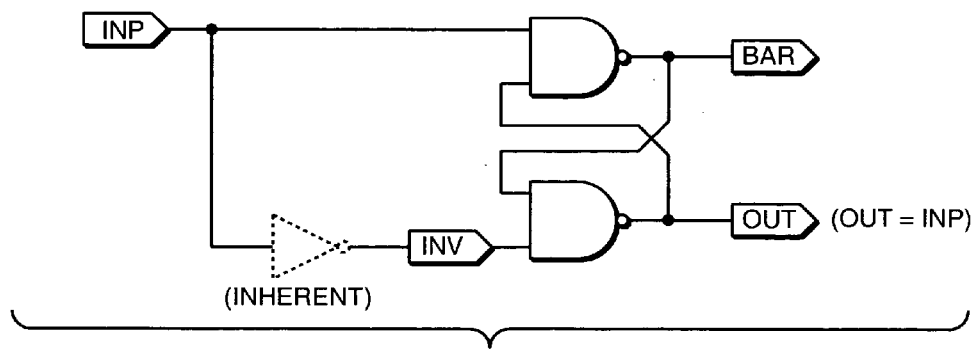
(OUT = INP)
(INHERENT)
FIG._11

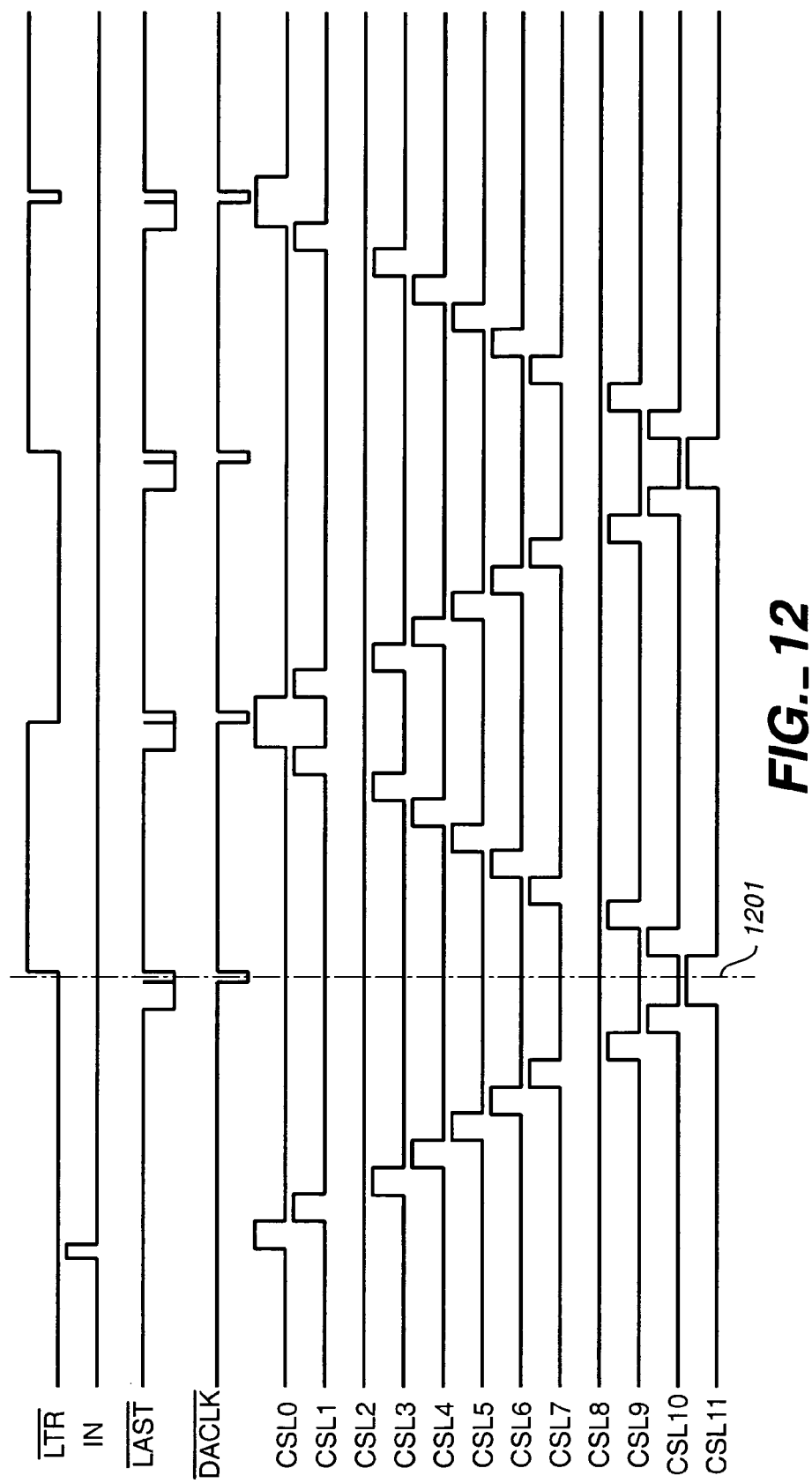
FIG._12

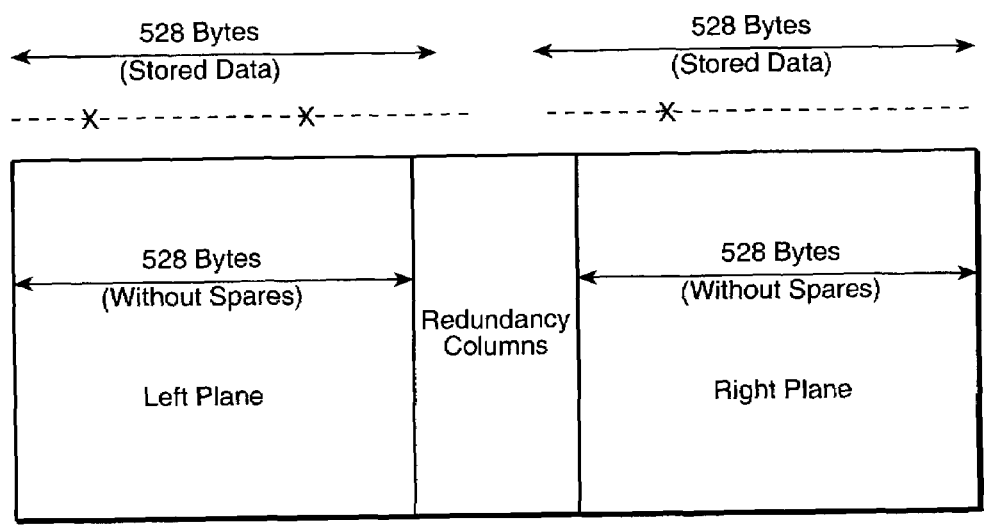
*FIG._13A*
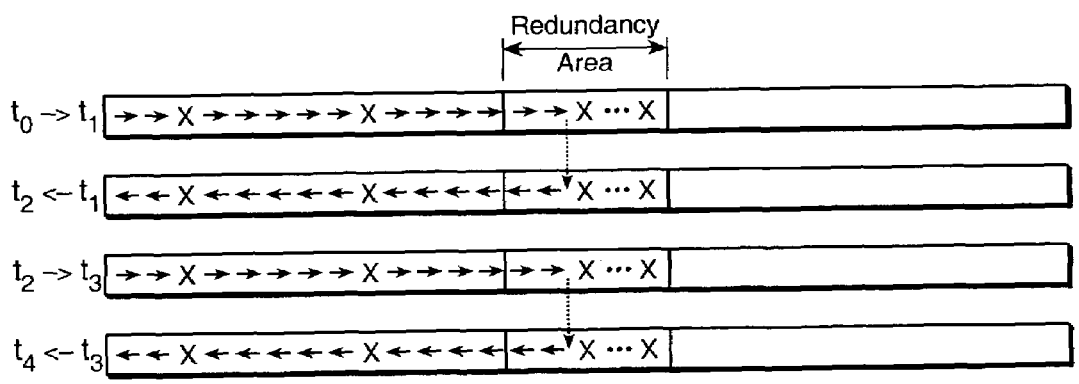
*FIG._13B*

FLEXIBLE AND AREA EFFICIENT COLUMN REDUNDANCY FOR NON-VOLATILE MEMORIES

FIELD OF THE INVENTION

This invention relates generally to non-volatile memories and their operation, and, more specifically, to techniques for avoiding bad portions of these memories when reading and writing data.

BACKGROUND OF THE INVENTION

The principles of the present invention have application to various types of non-volatile memories, those currently existing and those contemplated to use new technology being developed. Implementations of the present invention, however, are described with respect to a flash electrically-erasable and programmable read-only memory (EEPROM), wherein the storage elements are floating gates.

A number of architectures are used for non-volatile memories. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, 6,151,248, 6,426,893, and 6,512,263.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the U.S. Pat. No. 6,522,580, that is also hereby incorporated by reference, and references contained therein.

A memory will often have defective portions, either from the manufacturing process or that arise during the operation of the device. A number of techniques exist for managing these defects including error correction coding or remapping portions of the memory, such as described in U.S. Pat. No. 5,602,987, that was incorporated by reference above, or U.S. Pat. Nos. 5,315,541, 5,200,959, and 5,428,621, that are hereby incorporated by reference. For instance, a device is generally thoroughly tested before being shipped. The testing may find a defective portion of the memory that needs to be eliminated. Before shipping the device, the information on these defects is stored on the device, for example in a ROM area of the memory array or in a separate ROM, and at power up it is read by a controller and then used so that the controller can substitute a good portion of the memory for the bad. When reading or writing, the controller will then need to refer to a pointer structure in the controller's memory for this remapping. Having the controller manage this process has the disadvantage of requiring a lot of exchange of information between the controller and the memory portion, and, even within the controller itself, requires the pointer to be read whenever data is transferred. Furthermore, there are embedded embodiment applications for such non-volatile memories which lack a controller.

SUMMARY OF THE INVENTION

The present invention presents a non-volatile memory wherein bad columns in the array of memory cells can be removed. According to another aspect of the present invention, substitute redundant columns can replace the removed columns. Both of these processes are performed on the memory in a manner that is externally transparent and, consequently, need not be managed externally by the host or controller to which the memory is attached.

The invention provides a technique of accessing selecting circuits assigned to blocks of columns of an array of non-volatile storage units to hold data read or to be written into the memory cells. In a specific embodiment, the memory cells are multi-state memory with a shift register, which supplies a column select signal, having a stage for each column block of the array. A strobe pulse is shifted through this shift register, enabling a different column block with each clock. The particular selecting circuit that has been enabled by the strobe will then perform a certain operation. In a read mode, the selected selecting circuit will transfer the stored information through an output line to the output buffer for output from the memory circuit. And while in a data load mode before programming, the selected selecting circuit will receive data from an input buffer and put the data into the data latch for each column. This data will be written into a memory cell. Each stage of the shift register will have a circuit whereby it can be fused out of shift register mode, in which case it will not assert the column select signal and will pass the strobe on to the subsequent byte without waiting for the next clock signal.

An inventory of the bad columns can be maintained on the memory. In an exemplary embodiment, this inventory of bad column addresses can be compiled when the memory is tested and stored in a designated ROM block on the memory. At power up, the ROM block is read first and the list of bad column addresses will be loaded into an address register. Shift registers will then be scanned through with strobe pulses. When the bad column address is reached, the column isolation latch in the shift register will be set at a SKIP state.

The memory may also contain a number of redundant columns that can be used to replace the bad columns. These columns are not addressed as replacement columns from outside of the memory, but instead the shift register stages of the redundant columns are connected to those of the normal columns and the strobe pulse continues on to enable the appropriate number of substitute columns.

In an exemplary embodiment, the main array is divided into Left and Right sub-arrays sized to accommodate a small page size (512 user bytes plus a small number of additional overhead bytes) with the redundancy columns arranged in the middle of the two sub-arrays. That is, the two sub-arrays will share the redundancy columns. To effectively manage the replacement of the bad columns, a bi-directional shift register is implemented, where the strobe will migrate from Left to Right in the Left sub-array, and the strobe will migrate from Right to Left in the Right sub-array.

Additional aspects, features and advantages of the present invention are included in the following description of exemplary embodiments, which description should be taken in conjunction with the accompanying drawings.

BRIEF DESCRIPTION OF THE DRAWINGS

FIG. 1 is a block diagram of a non-volatile memory system in which the various aspects of the present invention are described to be implemented.

FIGS. 2a and 2b illustrates aspects of the present invention in a circuit and organization of the memory array of FIG. 1 when a NAND type.

FIGS. 3a–c show integrated circuits with latches for holding data to be read and written into the memory.

FIG. 4 shows an implementation of a latch.

FIG. 5 shows connecting a first data latch to an I/O line by placing a 1 in a first stage of a shift register.

FIG. 6 shows connecting a second data latch to the I/O line by placing a 1 in a second stage of a shift register.

FIGS. 7a and 7b are block diagrams of an embodiment of the column select circuits and various control signals used in their operation.

FIG. 8 is a block diagram of some elements of the data input/output circuits of FIG. 7A.

FIG. 9 is an exemplary embodiment of a Y-select block.

FIG. 10 is a schematic of an exemplary embodiment for the master latch.

FIG. 11 is a schematic of an exemplary embodiment for the slave latch.

FIG. 12 is a timing diagram showing the operation of the exemplary embodiment of FIGS. 8–11.

FIGS. 13a and 13b are a schematic representation on the redundant column substitution process.

DESCRIPTION OF EXEMPLARY EMBODIMENTS.

With reference to FIGS. 1–6, a specific non-volatile memory system is described in which the various aspects of the present invention are implemented, in order to provide specific examples. FIG. 1 is a block diagram of a flash memory system such as that described in U.S. Pat. No. 6,522,580, incorporated by reference above. Memory cell array 1 including a plurality of memory cells M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region (labeled as "WELL R" or "WELL L" in FIG. 2b) on which the memory cells (M) are formed. The c-source control circuit 4 controls one or more. common source. lines (labeled as "c-source L" and "c-source R" in FIG. 2b) connected to the memory cells (M). The c-p-well control circuit 5 controls the voltage of the c-p-wells. In some embodiments there may be a single p-well (rather than the two shown in FIG. 2b) and there may be a single c-source connection (rather than separate c-source L and c-source R).

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20.

Command data for controlling the flash memory device are input to a command interface connected to external control lines which are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

An example structure of the memory cell array 1 is shown with reference to FIGS. 2a and 2b, which is further described in a U.S. patent application Ser. No. 10/086,495, "Operating Techniques for Reducing Program and Read Disturbs of a Non-Volatile Memory", by Yan Li, Jian Chen, and Raul-Adrian Cemea, filed Feb. 27, 2002, 2002 and published Aug. 28, 2003 as number 2003016182, which is hereby incorporated by reference. A flash EEPROM of a NAND type is described as an example. The memory cells (M) are partitioned into 1,024 blocks, in a specific example. The data stored in each block are simultaneously erased, the block being the minimum unit of a number of cells that are simultaneously erasable. In the exemplary embodiment of U.S. patent application "Operating Techniques for Reducing Program and Read Disturbs of a Non-Volatile Memory", the division of the main array into Left and Right arrays sized to accommodate a small page size (512 bytes) and other aspects are described in more detail. The bit lines are also divided into left bit lines (BLL) and right bit lines (BLR). A number of redundant columns are arranged in the middle of the two sub-arrays, as discussed below. Sixteen memory cells connected to the word lines (WL0 to WL15) at each gate electrode are connected in series to form a NAND cell unit. One terminal of the NAND cell unit is connected to corresponding bit line (BL) via a first select transistor whose gate electrode is coupled to a first select gate line (SGDL or SGDR), and another terminal is connected to the c-source via a second select transistor whose gate electrode is coupled to a second select gate line (SGSL or SGSR). Although sixteen floating gate transistors are shown to be included in each cell unit, for simplicity, other numbers of transistors, such as 4, 8, or even 32, are used.

As discussed in the Background section, in the prior art the removal of bad columns and other defect management is generally managed by the controller. The information on defective portions of the memory is often maintained on the memory 22, such as in a ROM memory or in the header or spare portions of sectors of the array 1, as described, for instance, in U.S. Pat. No. 5,602,987, that was incorporated by reference above. For example, a ROM portion of the memory 22 may maintain an inventory of bad columns of the array 1, as determined and stored in the ROM when the memory is tested. At power up, the controller 20 would read the list of bad columns into a pointer structure. During a read or write process, the controller would consult this pointer structure and, when a logical address from the host corresponds to a bad column, substitute the address of a replacement column that is then sent along the address lines to the column control circuits 2.

One prior art system managing defective columns on the memory chip itself uses a binary decoding scheme to manage bad column replacement. The address from the host is first latched into a register and the column address is incremented by a 10-bit adder to manage the columns from 0 to 540 bytes. The column address (10 bits) is then pre-decoded into 15 to 20 lines which run through the column decoder area. Three signals are chosen from among these 15 to 20 lines to form a column select. Bad columns in this binary decoding system are managed by comparing an incoming column address with a list of bad column addresses. If a match is found, the incoming column address is reassigned to another, good column address. If the incoming address does not match the bad column addresses, the incoming column address is not changed. The binary column select scheme has a high degree of flexibility in locating random column addresses. However, it has the disadvantage is that it is relatively slow because of the multiple stages of logic necessary to replace a defective column, and this makes it difficult for the binary decoding scheme to run much faster than a 20 MHz data input or output rate.

FIGS. 3–6 show examples of a circuit architecture in which the present invention could be applied and are adapted from U.S. Pat. No. 6,560,146 which is hereby incorporated by reference. FIGS. 3a–c show examples of a circuit for reading and writing data to memory cells 301 of an integrated circuit. The integrated circuit may be a memory such as a Flash chip or may be an integrated circuit with an embedded memory portion, such as an ASIC or microprocessor with memory.

Read-write (SA) circuits 303 are coupled to columns of one or more bit lines of memory cells. The read-write circuits are used to read the states of the memory cells. The read-write circuits may be also be used to write or store data into the memory cells. The read-write circuitry may include sense amplifier circuits, as discussed further below with respect to the embodiment of FIG. 8.

A number of arrangements can be used for the latches and column select circuits. The embodiments of FIGS. 3a–c present different arrangements of the read-write circuit for the columns of memory cells. One arrangement is a "flat" structure, with each bit line having its own set of latches that can be directly accessed, either to load or output data, for transferring data to an input/output line in response to an enable signal from a column select circuit. In other embodiments, such as discussed further below with respect to FIG. 8, one read-write circuit may be shared among two or more columns of memory cells.

In the exemplary embodiments, the storage units are multi-state, capable of storing multiple bits of data per cell. For the purpose of serving as an exemplary embodiment to illustrate the principles of the invention, memory cells 301 of FIGS. 3a–c are dual-bit Flash EEPROM memory cells, so that the collection of memory cells selected by one word line can store either one page of user plus overhead data or two pages of such data, referred to as an upper and lower page.

More generally, the concepts readily extend to either binary memory cells or multi-state memory cells that can store more than two bits of data. Similarly, the discussion extends to non-volatile memories with other forms of storage units as the principle aspects of the present invention relate to how the storage units are accessed and arranged, and are not particular to how the data is written to, stored on, or read from the storage units.

In the example of FIG. 3a, there are two temporary storage circuits or data latches DL 306 and 309, one for the "upper" bit and one for the "lower" bit associated with and connected to each read-write circuit SA 303. The temporary storage circuits may be any circuitry used to hold data for the memory cells. In a specific implementation, the temporary storage circuits are latches; however, other types of logic may also be used. Each latch is connected to one of two input/output (I/O) lines, 333 and 336, used to input and output data into the latches. The details of the connection are not shown. In this simplified example, the latches and lines serve both the input and output function, although separate lines can also be used.

In the data input process, data is loaded bit-by-bit or more commonly byte-by-byte into the data latches. The Y-select circuits, such as 346, are used to manage which byte is selected at a specific WE (write enable) clock. Data is loaded into a particular latch based on a WE signal input of each latch (not shown in FIG. 3). When the WE signal is asserted (active low or active high signal) for a particular latch, then that latch is loaded. For example, in FIG. 3c the Y-select circuit 346 will select a particular data set on the I/O bus (lines 333, 336, 338, 340) that will then be connected to the selected data latches (306, 309, 314 and 322), which can be similar to those in FIG. 4.

In the data output processes, the data can be read out serially from a column of registers at a time. The Y-select will select a byte at a specific RE (Read Enable) clock. The data will transfer from the data latch to the I/O bus and from there the data will be transferred to the output buffer.

In FIG. 3b, each input/output circuit 303 has four associated data latches, 306, 309, 314, and 322, with the first two respectively corresponding to the lower and upper bits for programming and the second two respectively corresponding to the lower and upper bits for reading.

In a folded structure, such as FIG. 3c (or FIG. 8, below), multiple input/output circuits such as 303a and 303b are stacked on top of each other. In this example, one of the input/output circuits belongs to an odd bit line and the other belonging to an even bit line. In a two bits per cell arrangement, there is a corresponding upper bit and lower bit data latch for each input/output circuit. As in FIG. 3a, the same latch is used for both the read and program data, although in a variation separate data latches for program and read can be used. As is described more with respect to FIGS. 7a and 7b, since this is a folded structure, the strobe pulse of the shift register will travel first in one direction, say from right to left, to access one of the bit lines, and when it meets the (counter defined) boundary, the strobe will turn around to go from left to right to access the other of the bit lines.

The I/O connections can have several options. In one case where the two bits stored in one physical cell belong logically to the same page and are written at the same time, it may be convenient to use two I/O lines, 333 & 336, to load the corresponding data latches 306 and 309 simultaneously (FIG. 3a). In the case of separate data latches for program and read as in FIG. 3b, the data latches 306 and 309 for program may be connected to DIN lines (Data In lines from input buffer), and the data latches 314 and 322 used for reading may be connected through I/O lines to output buffers.

In a another case often used in traditional NAND architectures, as described in U.S. patent application Ser. No. 10/086,495 incorporated by reference above, the lower bit data and upper bit data stored in each physical cell logically belong to different pages and are written and read at different times. Therefore, the lower bit data latch and the upper page data latch will be connected to same IO line.

An example of a specific circuit implementation of a latch is shown in FIG. 4. An input I/O is the data input to the latch, such as 306, and will be connected to an input line, such as 333. The column select signal CSL is connected to a pass transistor or pass gate 402 that allows data to be connected to or disconnected from the input. The signal CSL is supplied from the Y or column select circuit YSEL that corresponds to one stage of the shift register 346 of FIGS. 3*a*–*c*. This example of a latch circuit includes cross-coupled inverters to hold data and also connects to the read-write circuit so that data may be passed between the circuits. Other circuit implementations for a latch may also be used, such as NAND, NOR, XOR, AND, and OR gates, and combinations of these.

In this example, a read enable signal RE and write enable signal WE will be the clock to control the YSEL. A strobe will be propagate along the YSEL stages of the shift register. In the case of a folded structure, when the pulse reaches the last stage, it will propagate back in the other direction. When CSL is high, the data latch will be selected. The I/O line will then get the data from or put the data into the data latch. There are other possible implementations than a single input/output (I/O) line as described with respect to FIG. 3*b*.

The exemplary embodiment of FIG. 4 shows an NMOS or n-channel pass transistor. There are many ways to form a pass gate and any of these techniques may be used. For example, a CMOS pass gate, that includes NMOS and PMOS transistors connected in parallel, may be used. Also, a high voltage pass gate may be used. For example, a high-voltage NMOS pass gate is enabled or turned on (or placed in an on state) by placing a high voltage, above VCC, at its gate or control electrode. An NMOS pass gate is turned off or put in an off state by placing its control electrode at VSS or ground.

U.S. Pat. No. 6,560,146, which was incorporated by reference above, describes several arrangements for the relation of the data I/O lines and the data latches in more detail. If the data latch is "flat", as shown in FIGS. 3*a* and 3*b*, then the lines connected to 306, 309, 314, 322 belong to different I/O lines. In the FIG. 3*a* embodiment, each read-write circuit is connected to and has two latches associated with it that serve as both input and output latches. Alternately, as in FIG. 3*b*, two of these latches can be used to hold the data to be written into the memory cell, and two latches are used to hold the data read out of the memory cell.

The write data is input into the latches via the appropriate input lines and then written using the appropriate read-write circuit into the memory cells. Data from the memory cells is read out using the sense amplifier and stored into the latches. The read data is output from the latches using the appropriate output lines. The communication line between the latch and the read-write circuit is not shown.

Data is input from the latches one at a time using the input lines. This is done by using a column select signal (CSL), as described above, so that the latches associated with a read-write circuit or column in the array are connected to the input lines one at a time. The CSL signal for the latches comes from the shift registers. The shift registers are loaded with a pattern (for active high logic) which is all 0s, except for one 1 (e.g., 0001000000). This bit may be referred to as a strobe bit. For example, shift register associated with the first column has a 1, and the rest of the shift register bits contain 0. This 1 is connected to the ENABLE input of the latches for the first column, which connects one or more of these latches to the I/O lines 333, 336, 338, and 340. Data can be read or written to this column. The input to the shift register is connected to 0 and the shift register is clocked. The 1 propagates to the next shift register stage. This 1 is connected to the ENABLE input of the latches for the second column, which connects these latches to the I/O lines. This operation continues until the desired data is read or written from the latches.

FIGS. 5 and 6 show more clearly the operation of latches and shift register. In FIG. 5, the first shift register has a 1; the data latch associated with that shift register and column is connected to the I/O line. In FIG. 6, the shift register has been clocked, and the next shift register bit has the 1; the data latch associated with that shift register and column is connected to the I/O line. The circuitry may also be designed for an active low LOAD signal. Then, the shift register will contain all 1s and a 0 for the particular latches to be enabled (e.g., 1110111111).

The preceding discussion illustrates the general principles involved and assumed that there is one (or two) bit lines per sense amp and one shift register stage per one or two sense amps. However, the concept can be usefully generalized such that there is one shift register stage per group of sense amps, the group of bit lines forming a column block. For example, there may be one or a few bytes of data associated with one column block, requiring, for example, 8 to 32 input lines in place of the one to four input lines shown in FIGS. 3*a*–*c*. In one specific example following the structure of FIG. 3*a*, each single BL line would consist of 8 bit lines, Sense Amp 303 would read from and write to each of the 8 bit lines, each Data Latch 306 and 309 would hold 8 bits of data, and the upper bit and lower bit lines 333 and 336 would each be 8 bits wide. This allows a byte of data to be entered or read from each column block simultaneously.

In the case where one or more bit lines within a column block is bad, a method is needed to skip over the bad column block. For example, in the scheme of FIGS. 3–6, if one column within the column block associated with shift register 900-2 and data latch 800-2 were bad, then the memory needs to skip the entire column block. In the prior art, this would typically be accomplished by the controller not addressing the bad column and reassigning addresses, which, as it is not performed solely on the memory 22 (FIG. 1), is not readily accomplished in an embedded environment that has no controller. Instead, according to one aspect of the present invention, the pulse of FIG. 5 passes through shift register 900-2 without waiting for a second clock pulse and without selecting the latch 800-2 to supply data to the I/O line. In another aspect of the present invention, this process is handled entirely on the memory 22: In effect, shift register 900-2, data latch 800-2, and the column block with which they are associated become transparent as seen from the controller 20 or the host.

FIG. 7A presents these and other aspects of the invention in a more general context. In this figure, the shift registers are replaced by the Y-select blocks YSEL 900-*i*, corresponding to the column control circuits of FIG. 1, and the data input/output circuits YBLOCK 800-*i* that compose part of the data input/output circuits 6 of FIG. 1. FIG. 7A shows the relation of these elements and various control signals used in their operation.

In FIG. 7A, series of M+1 Y-select blocks YSEL0 900-0 to YSELM 900-M receive a common clock signal CLK. The output OUT of each Y-select block 900-i is connected to the YSEL block on either side through a right input RIN and a left input LIN. Which of the two inputs RIN and LIN is active is determined by the left-to-right signal LTR: when LTR is high, LIN is active and each of the Y-select blocks 900-i shift the pulse to its neighbor on the right; when LTR is low, RIN is active and the pulse travels to the left. When a Y-select block receives the pulse from its neighbor, it asserts the signal CSL and passes the signal on to its other neighbor at the next clock cycle.

Each Y-select block 900-i has a distinct input FUSE that indicates whether the column is bad and needs to be skipped. When FUSE is set for a given Y-select circuit, CSL is not asserted and the shift register acts as a buffer to pass the pulse to the next stage so that the pulse passes through to the next Y-select block without waiting for the next clock cycle. The values for FUSE-i can be stored in a ROM portion of the memory 22 and read out at power up to set the FUSE signals to the Y-select blocks. The list of bad columns can be established when the memory is tested and written into the ROM.

FIG. 7B shows an example of how the YSEL 900 and YBLOCK 800 circuits can be arranged with respect to the memory array. In FIG. 7B, the memory array 1 is again divided into a left and right potion as in FIG. 2B. As the left and right portion can be read and programmed independently, each side has an independent set of Y-select circuits 900 and input/output circuits YBLOCK 800 that would have their own input pulse IN into the first shift register in the chain of, here, 4 YSEL blocks. To improve the layout of the circuit, half of the YSEL/YBLOCK circuits in each side can be placed above the array 1, with the other half placed below, as shown in FIG. 7B. The arrangement in the array of the redundant columns used to replace defective columns is described below with respect to FIGS. 13a and 13b. In the specific. case where the basic unit of data transfer in or out of the memory 22 is a byte, there would be at least 4 data I/O lines (or possibly 4 DATA IN lines and 4 DATA OUT lines) associated with the YBLOCK circuits on the top of the memory and another set of 4 data I/O lines associated with the YBLOCK circuits on the bottom of the memory. The state of the YSEL circuits, specifically CSL, controls which YBLOCK communicates with the data I/O lines at any given time.

The CSL signal from each Y-select circuit is connected to a corresponding set of programming, sensing, data storage, input and/or output circuits, shown here as YBLOCK 800-i. In the embodiment of FIGS. 3–6, each shift register was connected to only a single set of read/write circuits, but in general there can be more. In particular, FIG. 7A shows two YBLOCKs, 800-ia and 800-ib, associated with each YSEL 900-i.

FIG. 8 is a block diagram of some elements of the data input/output circuits YBLOCK 800-i of FIG. 7A, and illustrates an additional embodiment of the invention in which multiple data latches can be incorporated into a column block. This can be useful for performing certain functions directly on the memory chip and requiring minimal data transfer between the memory chip and the controller, thus improving performance. For example, it is useful to have multiple data latches for receiving next page data during a sequential programming operation. While one set of latches contain the current data being programmed, a second set of latches can be loaded with new data for the next programming operation, allowing overlapped programming and data transfer. A second use for additional data latches occurs when data needs to be copied from one page to another page within the memory 22, or when each memory cell contains data from two different logical pages as described in U.S. Pat. No. 6,522,580.

The concept of multiple sense amps and data latches in a common Y-block has been described in U.S. patent application Ser. No. 10/254,483, "Highly Compact Non-Volatile Memory and Method Thereof", by Raul-Adrian Cemea, filed Sep. 24, 2002, which is hereby incorporated by reference. This patent application also describes a stack bus (similar to bus 803) by which the various components can be interconnected and data entered and exchanged between them and external I/O lines. Additional aspects of these and other elements are described further in U.S. patent application Ser. No. 10/254,919, filed Sep. 24, 2002, and in U.S. patent application Ser. No. 10/665,828, filed Sep. 17, 2003, both of which are also hereby incorporated by reference.

Y-Block 800 consists of multiple data latches 802a, 802b, through 802n that can store data to be used by the Sense Amps 803a through 803n for either reading or writing. A central control unit labeled Input/Output & Control 801 is used to control access to the global I/O Data Lines 805 when selected by input signal CSL from the associated YSEL circuitry. Each of the sense Amps 803a through 803n is associated with one or more bit lines (BL). In some NAND architectures it is common to associate two bit lines (odd and even) with each sense amp and read them at different times. In other NAND architectures it is desirable to read all bit lines simultaneously, requiring one Sense Amp for each bit line. There may also be one or more dedicated data latches included within each Sense Amp. The fact that multiple. Sense Amps are shown in this block is an indication that typically at least one or more bytes of data would be accessed by this block, though this is not a requirement. The data width of each Data Latch is typically as wide as the number of I/O Data Lines. For example, if there are 8 I/O Lines (or 8 Input Lines and 8 Output Lines) crossing the central control unit, each Data Latch would typically hold 8 bits.

In one embodiment, both the Sense Amps and the central control unit 801 can access the data latches at random and in any desired order. In this case bus 804 carries both data and control information. In another more restricted embodiment, the Data Latches may be accessed in series such that data is shifted from the central control unit 801 to Data Latch 802a, then from Data Latch 802a to Data Latch 802b, and so forth to Data Latch 802n. In this case the control signal DACLK 806 (described below in conjunction with FIG. 12) would be routed to each of the Data Latches to effect that transfer.

In a write process, the data is received from the I/O Data Lines 804 under control of CSL, from which it is supplied to one of the data latches. If the Data Latches are connected in series, it would be applied to Data Latch 802a and subsequently shifted through all the Data Latches to the Sense Amp and written into the memory. A read process is essentially the reverse in which data is read from the Sense Amps and placed in Data Latch 802n and shifted up through the other Data Latches to the I/O Data Lines 805. In an alternate embodiment (not shown), the I/O Data Lines consist of two sets of lines: Input Lines loading Data Latch 802a and Output Data Lines driven from Data Latch 802n.

FIG. 9 is a schematic for an exemplary embodiment of the Y-select block 900. This particular embodiment is formed from a master latch MSTR 1000 and a slave latch 1100. Both latches are connected to the clock CLK, receive an input signal INP and its complement INV, and supply an output OUT and complement BAR. The signals OUT and BAR of the master latch 1000 are respectively connected to INP and INV of the slave 1100. The output of the slave latch is the OUT signal of block 900 in FIG. 7A, the inverse signals being suppressed in that figure.

The input NP of the master 1000 is connected to the left input LIN and right input RIN through switch 931, that also connects the inverse input INV of the master to the inverses of LIN and RIN, LIB and RIB respectively. When the left-to-right signal LTR is asserted, LIN is connected to INP and LIB to INV; when the right-to-left signal RTL, the inverse of LTR, is asserted, RIN and RIB are respectively connected to INP and INV. In this way, when an input pulse arrives from the Y-select block to the immediate left (for LTR asserted) or the immediate right (for RTL asserted), it is clocked through the master and slave latches and passed on to the following select block.

The output OUT of the slave SLVE 1100 is also supplied to NAND gate 910. Consequently, when the output OUT is high (and FSB, as explained below, is also high) and the clock pulse arrives, the NAND output goes low and is inverted by 911 to assert the column select signal CSL of the Y-select block. In this particular embodiment, the NAND gate 910 also receives an input labeled SRO to indicate the serial readout mode is enabled: in other embodiments, the SRO signal may be absent or replaced with other control signal to enable/disable the CSL signal. Although CSL is not clocked directly by applying CLK as an input of 910, as OUT is a clocked signal, CSL is clocked indirectly through this input.

The other input of NAND gate 910 is the fuse enable signal FSB, that is used to switch out a bad column block: unless FSE=$\overline{\text{FSB}}$ is set low, the column select signal will not be asserted. The value of FSE is held in the latch composed of the inverters 923 and 924. FSE is also supplied to master latch 1000 and its inverse FSB is supplied to slave latch 1100. These signals convert the latches into a pair of un-clocked buffers by essentially overriding the clock signal and passing the input of the Y-select block directly to the output. Many possible embodiments can be used for the master register 1000 and slave register 1100, with one particular example given in FIGS. 10 and 11.

The value of FSE is set through the signals PURB, SET, I12 and I34, which were collectively indicated as FUSE in FIG. 7A. This signals I12 and I34 are respectively connected to the transistors 929 and 927 and indicate whether the column block is bad. In the exemplary embodiment with a column having four bit lines, I12 corresponds to the first and second bit lines of the column and I34 the third and fourth. The values I12=I34=0 indicate the column is good, while either of I12=1 or I34=1 indicate a bad column. In other arrangements, for example, each bit line could have its own indicating transistor in parallel or all four could share a single transistor. At power up, the bad column values are read from the memory ROM and the values of I12 and I34 are set. Transistor 921 is then turned on to charge up node X by PURB, after which the charge is trapped, setting node X high. Transistor 925 is then turned on by a pulse of the signal SET. If the column is good, I12=I34=0 and the node X stays high setting FSB=1 and FSE=0; if the column is bad, I12=1 or I34=1 and node X is taken to ground setting FSB=0 and FSE=1.

The bad column information can be saved in a designated ROM block for transfer to update the shift register latch (or column isolation latch) in FIG. 9. In an embodiment based on FIG. 9, a certain data pattern saved in a first word line of the ROM memory, with "1" indicating a bad column, "0" indicating a good column. The reversed data will be saved in a second wordline. The purpose in storing both the data and its inverse is to insure the integrity of the stored data. If a bit line (in the metal) is physically open or shorted or has another fault, then both the bad column data and its inverse can not read out correctly. In that case, the column can be automatically discarded. At power up, a two read sequence is to be executed to read the data from the first ROM word line first and compare this with the data read from the second wordline. If the data is good data, then it will be used to set the column isolation latch composed of inverters 923 and 924 in FIG. 9. This method allows a direct one-to-one correspondence between the ROM data to the column latches, which makes updating the latches more straightforward. However, as the bad column information is only saved once, the integrity of the data is less robust through the lifetime of the chip. This method is useful in the NOR structure where read disturbs are less prevalent since there are no other cells in the read chain to be affected by reading a particular cell, as in the NAND architecture where all the cells in the chain can be affected.

In another method for updating the bad column information from the designated ROM block to the shift register latch in FIG. 9, the list of bad columns is stored in more than one location. This method will be more robust in memory systems more prone to disturbs and can be used in memories with a "plane" structure, such as described in U.S. Pat. No. 6,426,893, which is hereby incorporated by reference. After test and evaluation, the bad column addresses can be stored in the designated ROM blocks, with both the information and its inverse stored on the same page. In this embodiment, the address information is also duplicated in the ROM block of the other planes.

For example, if the memory chip has two planes, and there are left and right sub-arrays in each plane, then the bad column addresses are saved in 4 pages in the ROM blocks on the same WL. The data is saved on the same WL for instant read-out upon power up. In this way, four copies of same data will be readout in one read, and the data will be compared to eliminate the bad data. The column address data can then be temporarily loaded into a register. The Shift Register will toggle through every column, if the column address matches the bad column address, the SET signal will go high to set node X in FIG. 9 low. In this method, only one of the pull down transistors 927 and 929 are needed, and the signal to the gate of the remaining transistor changed. For example, here. FIG. 9 would be modified so that transistor 929 can be deleted and the input to the gate of transistor 927 will now be the signal CSL instead of I34.

FIG. 10 is a schematic of an exemplary embodiment of the master latch 1000. As shown on the right hand side of latch 1000, transistors 1001 and 1003 respectively controlled by CLK and FSE are connected in parallel between the OUT node and ground, with PMOS transistors 1005 and 1007 again respectively controlled by CLK and FSE connected in series between the high logic value and the OUT node. Consequently, when the signal FSE=1 is asserted, the CLK signal is overridden and is unable to affect the output of the circuit. The cross-coupled left hand side of FIG. 10 operates in a complementary manner to the right side using INP as the input and providing BAR as the output. When FSE=1, FIG. 10 then degenerates into a pair of cross-coupled NOR gates arranged as a set-reset latch with INP and INV as the two input signals, and OUT=INP at all times (since INV is always the complement of INP). Functionally in this condition the circuit acts as a logical buffer.

FIG. 11 is a schematic of an exemplary embodiment of a slave latch 1100 constructed in a complementary manner to the master latch 1000 of FIG. 10. As shown on the right hand side of FIG. 11, when FSE=1, FSB=0 and the CLK signal is again overridden and is unable to affect the output of the circuit. For example, when FSB=0, the level at node Y is determined by the value of INV on transistor 1102 since transistor 1103 is held open and the effect of transistor 1101 is cut off from node Y regardless of the value of CLK. Similarly, FSB=0 causes transistor 1104 to be permanently on and the effect of CLK on transistor 1105 is of no consequence. In this case the circuit of FIG. 11 degenerates into a pair of cross coupled NAND gates arranged as a set-reset-latch with inputs INP and INV, and OUT=INP at all times (since INV is always complementary to INP). Again, the circuit becomes functionally equivalent to a buffer. Thus the series combination of MSTR 1000 and SLVE 1100 provides its input, either LIN or RIN depending on the how switch 931 is set, directly to the output of Y-select block 900 for the next Y-select block in FIG. 8 to receive.

FIG. 12 is a timing diagram showing the operation of the exemplary embodiment of FIGS. 8–11. The top line is the signal $\overline{LTR}$ (RTL in FIG. 9) and will be low when the pulse is passed to the right in the Y-select circuits 900-$i$ of FIG. 7A, and high when it flows back to the left. The initial pulse or strobe IN that is applied to the input LIN of 900-0 is shown on the second line. The signal $\overline{LAST}$ indicates when the last Y-select circuit (either the YSELM 900-M on the right or YSEL0 on the left of FIG. 7A) is reached by going low. $\overline{DACLK}$ is the signal applied to the Y blocks 800-$i$ of FIG. 7 to load data into the Data Latches or shift the data between them for the next time CSL is asserted. In the case of a non-folded structure, the pulse only shifts through the Y-select circuits once and the signals RTL, $\overline{LAST}$, and $\overline{DACLK}$ are not needed; this simplified case is the area to the left of the broken line 1201.

The waveforms below $\overline{DACLK}$, CSL0–CSL11, show the control signals CSL from the Y-select circuits. In this particular example, there are twelve columns and corresponding Y-select circuits, or M=11. in FIG. 7A, and four Data Latches 802$a$–802$n$ in FIG. 8 controlled by each Y-select circuit. FIG. 12 shows the operation of the circuit after it has been initialized and the bad columns, in this example columns 2 and 8, have been fused out. This initialization consists of reading the list of bad bit lines, for example from the memories ROM at powerup, and supplying this information to the Y-select circuits, such as by the signals I12 and I34 in FIG. 9. The signal PURB is then taken low, followed by SET going high to set the value of FSE of FIG. 9 for each of the Y-select circuits 900-$i$ of FIG. 7A.

At the beginning of FIG. 12, $\overline{LTR}$ is low so that LIN is active in Y-select 900 and switch 931 of FIG. 9 connects LIN to INP. The pulse IN arrives at LIN of YSEL0 900-0 in FIG. 7A and in the next clock cycle CSL0 is asserted, followed by CSL1 in the cycle after that. As column 2 has been fused out, the pulse passes through YSEL2 900-2 without waiting for the clock, CSL2 stays low, and CSL3 is asserted at the clock immediately following the one at which CSL1 is asserted. CSL4–CSL7 follow in each of the subsequent cycles, the bad column 8 is skipped as with column 2, and CSL9–CSL11 follow in order after CSL7.

In an embodiment with only a single Data Latch for each Y-select circuit, the process would finish at this point, corresponding to the broken line. For embodiments having multiple Data Latches, the process switches to send the pulse back to the left: $\overline{LTR}$ goes high to activate the RIN inputs of the Y-select circuits and $\overline{DACLK}$ goes low to reset the Y blocks 800-$i$. The signal $\overline{LAST}$ is taken low when the pulse reaches the end of the line (YSELM or YSEL0) to hold the pulse in the end registers for an additional clock cycle and assert CSL longer while $\overline{DACLK}$ and $\overline{LTR}$ change. (The connection of the signal LAST to the end YSEL blocks is not shown in FIG. 7A.)

The signals then flow back to the other direction, asserting CSL11–CSL0 in order at each cycle and again skipping columns 2 and 8. Once Y-select block 0 is reached, CSL0 is held high for two cycles by $\overline{LAST}$, during which time $\overline{LTR}$ is taken back to low and the Data Latches are set up to receive new data. The process then continues as before to load the additional Data Latches and the process is complete.

As the bad columns, columns 2 and 8 in FIG. 12, are removed, as seen from external to the memory circuit 22, the array effectively has 10 good columns, with column 3 perceived as the (now removed) column 2, and so on for the rest of the columns. Consequently, the number of accessible "standard" columns is the actual number of these standard columns less the number of removed bad columns. Thus, again as seen from outside of the memory, the number of accessible standard columns in a block is less than the expected number as the removal of the bad columns is transparent to the controller and the host. As long as the controller/host does not request more than this accessible number of standard columns, this presents no difficulty; however, if the number of requested columns exceeds the number of accessible standard columns, these will be used up before the number of requested columns have been found. Therefore, according to another aspect of the present invention, a set of redundant columns is provided in each sector to replace the removed bad columns.

As with the removal of bad columns, this replacement of bad columns with redundant columns is again a transparent process as seen from external to the memory 22. This transparency makes the present invention particularly useful in embedded environments, where the memory 22 of FIG. 1 is placed directly into the host without use of a controller 20.

Referring back to FIG. 12, the waveforms for a total of 12 column blocks are shown where blocks 2 and 8 are removed. If the memory plane to which these columns belong have 12 or more standard column blocks, then no redundant column blocks are used and after column block 2—and again after column block 8—the physical columns being used on the memory are shifted from the logical columns as addressed on the address lines. If instead, the entire memory plane had only 10 standard column blocks, column blocks 10 and 11 would now be physically present in the redundant column area.

FIGS. 13$a$ and 13$b$ are a schematic representation of the redundant column substitution process in an exemplary embodiment. FIG. 13$a$ shows one possible architecture of a memory array, consisting of a left and right plane, each of which holds 528 Bytes of data on each word line. FIG. 13$b$ shows how the column block substitution process proceeds as data is written into the array. The basic assumption is that in order to program all cells on one word line, data will be written into four separate Data Latches (802$a$–802$d$ in FIG. 8) in each column block. For example, if the external controller transmits one page of 528 bytes (512 bytes of User Data and 16 bytes of Overhead Data such as ECC or other information to be written into the memory) by transmitting one byte at a time before issuing the write command, one byte of data will be transmitted during each clock cycle, and to load the entire page the shift register will scan through the available column blocks in a plane four times. This means that each plane consists of 132 (=528 Bytes/4 pages) column blocks and each block contains 32 (4 Passes *8 bits/byte) bit lines. In FIG. 13*b*, all of the normal columns of the left half-array are to be accessed and two of these columns blocks are bad. As the pulse IN will travel through the full number of columns, the two bad column blocks are replaced by two redundant column blocks. In FIG. 13*b*, the non-used blocks are indicated by an x. The pulse begins at the left side and is propagated until it reaches the first bad column block, which is then skipped. The pulse then continues through the rest of the normal section, again skipping the second bad column block. As there are still two column blocks missing, the pulse continues on and picks up two extra column blocks in the redundancy area. As only two redundant blocks are needed, the remaining portion of the redundancy area is ignored and not accessed, as shown by the x's, and the process continues with a second pass toward the left. The last pulse of one pass and first pulse of the next pass are the same CSL signal and are held by the LAST signal for an extra clock signal while the DACLK signal is asserted and the RTL value changed. The bad column blocks are again skipped and the process similarly continues through the third and fourth tiers. Note that each column block holds data from widely separated logical bytes of the input data stream. For example, the first column block holds data from bytes 1, 264, 265, and 528.

The boundary in the redundancy area at which the pulse turns around is not a fixed boundary, but determined by the number of blocks needing to be replaced. This is illustrated schematically in FIG. 13*b* where the left and right sides of the array structure share the redundancy columns to make the replacement process more flexible. This is again shown for an exemplary embodiment having a folded structure and using bi-directional shift registers. In this example, each sub-array is structured to hold 528 bytes of data along each word line. In the middle are placed the redundancy blocks. Both the right and left sides will access the number of redundant columns needed to replace their corresponding number of bad columns. As shown in FIG. 13*a*, the left array has two bad column blocks (as again shown by the x's) and will consequently appropriate two of the redundant column blocks with the pulse extending in to access these extra blocks before propagating back to the left. Similarly, on the right side shown with one bad block, the pulse begins on the right and will travel in to access one replacement block from the redundant area before travelling back to the right.

Although the various aspects of the present invention have been described with respect to specific embodiments, it will be understood that the invention is protected within the full scope of the appended claims.

The invention claimed is:

1. A non-volatile memory comprising:
an array of non-volatile storage units arranged into a plurality of bit lines and forming one or more rows;
a data transfer line;
a plurality of data transfer circuits each connectable to a respective set of one or more of the bit lines and the data transfer line to transfer data between the respective set of bit lines and the data transfer line, wherein data is transferred between each of the data transfer circuits and the data transfer line in response to a respective column select signal; and
a plurality of column select circuits connected to form a clocked shift register, having a clock input, each connected to a respective data transfer circuit to provide the respective column select signal, and each having a fuse input, wherein when a fuse signal is asserted on the fuse input, the column select circuit passes the shift register pulse to next stage in the shift register without waiting for the clock and without asserting its respective column select signal.

2. The non-volatile memory of claim 1, wherein each of the data transfer circuits comprises:
a set of one or more temporary data storage unit to store data transferred between the respective set of bit lines and the data transfer line.

3. The non-volatile memory of claim 2, wherein each of the data transfer circuits further comprises:
a output circuit connectable to the data transfer line in response to the respective column select signal, wherein the set of said temporary data storage units are a plurality and wherein the output circuit can randomly access each of said plurality of temporary data storage units.

4. The non-volatile memory of claim 3, wherein each of the data transfer circuits further comprises:
a plurality of sense amplifiers, wherein the respective set of bit lines is a plurality and the number of said sense amplifiers is the same as the number of bit lines in said respective set and wherein each bit line can randomly access each of said plurality of temporary data storage units through a corresponding one of the sense amplifiers.

5. The non-volatile memory of claim 2, wherein each of the data transfer circuits further comprises:
a output circuit, wherein the set of said temporary data storage units are a plurality connected in a first in, first out manner with the last of the temporary data storage units connected to the output circuit and the corresponding set of bit lines are connectable to the first of the temporary data storage units, and wherein the output circuit is connectable to the data transfer line in response to the respective column select signal.

6. The non-volatile memory of claim 5, wherein each of the data transfer circuits further comprises:
a plurality of sense amplifiers, wherein the respective set of bit lines is a plurality and the number of said sense amplifiers is the same as the number of bit lines in said respective set and wherein each bit line is connectable to the first of the temporary data storage units through a corresponding one of the sense amplifiers.

7. The non-volatile memory of claim 6, wherein for each of said data transfer circuits, the number said temporary data storage units in the set is a multiple of the number of bit lines in the corresponding set of bit lines.

8. The non-volatile memory of claim 7, wherein said non-volatile storage units each can store N bits of data and the ratio of the number of temporary data storage units to the number of bit lines is N, wherein N is an integer greater than or equal to one.

9. The non-volatile memory of claim 2, wherein each of the data transfer circuits further comprises:
an input circuit, wherein the set of said temporary data storage units are a plurality connected in a first in, first out manner connected to the input circuit and the corresponding set of bit lines are connectable to the first of the temporary data storage units, and wherein the input circuit is connectable to the data transfer line in response to the respective column select signal.

10. The non-volatile memory of claim 1, wherein each of said column select circuits comprises:

a master register and a slave register, wherein said column select signal is asserted in response the output of the slave register when the fuse signal is de-asserted.

11. The non-volatile memory of claim 10, wherein each of said column select circuits comprises:
a master register and a slave register, wherein said column select signal is asserted in response to the output of the slave register when the fuse signal is de-asserted.

12. The non-volatile memory of claim 11, wherein in response to the fuse signal being asserted in a respective column select circuit, the corresponding master and slave registers are each converted into unclocked buffers or inverters.

13. The non-volatile memory of claim 1, further comprising:
a ROM memory portion containing bad column information, wherein the fuse signals are determined from said bad column information.

14. The non-volatile memory of claim 13, wherein the fuse signals are determined by the memory at power up.

15. The non-volatile memory of claim 1, wherein each of said shift registers is connected to receive a directional control signal, and wherein when the directional control signal is asserted in the shift register each of said column select circuits is connected to receive the shift register input from the adjacent shift register to its left and when the directional control signal is de-asserted in the shift register each of said column select circuits is connected to receive the shift register input from the adjacent shift register to its right.

16. A memory system circuit, comprising:
a controller; and
a memory comprising one or more independently controllable non-volatile data storage sections connected to the controller, wherein each of said storage sections comprises:
an array of non-volatile user data storage units arranged in rows and columns;
a memory portion containing bad column information; and
column select circuitry connected to the array and the memory portion containing bad column information, wherein bad columns are replaced based on the bad column information in a manner transparent to the controller.

17. The memory system circuit of claim 16, wherein the user data storage units are multi-state storage units.

18. An integrated circuit comprising:
a plurality of nonvolatile storage units arranged in rows and columns;
a plurality of programming circuits coupled to the columns of storage units;
a plurality of sense amplifiers coupled to the columns of storage units;
a plurality of latch circuits able to temporarily store data, coupled to either the programming or sensing circuits, or to both;
a plurality of input circuits coupled to the storage units;
a plurality of output circuits coupled to the storage units
a ROM memory storing bad column information; and
a shift register comprising a plurality of pointer shift register stages coupled to the ROM memory portion, wherein each stage has a clock input and is coupled to an enable stage of either one or some of the programming, sensing, data storage, input and/or output circuits except for those stages corresponding to a bad column as identified by the bad column information.

19. The integrated circuit of claim 18 wherein the memory cells are floating gate, Flash, EEPROM, or EPROM memory cells.

20. The integrated circuit of claim 18 wherein each stage of the shift register comprises a master-slave register.

21. The integrated circuit of claim 18 wherein the storage unit stores are multistate memory cells.

22. The integrated circuit of claim 18 wherein combinations of multiple latch circuits can be assigned to store multiple bits of information.

23. A method of operating an integrated circuit comprising:
providing a plurality of latches to hold data associated with a respective one of a plurality of columns of memory cells;
providing a shift register having a plurality of stages with an output coupled to an enable input of a respective latch;
fusing out one or more of the shift register stages;
loading a strobe bit into a first stage of the shift register to enable coupling of the corresponding first latch to an input line; and
clocking the shift register to advance the strobe bit from the first stage of the shift register to the subsequent stages to enable coupling of the corresponding subsequent latches to the input line, wherein when a stage is fused out the strobe bit is advanced through the fused out stage without being clocked and without the fused out stage enabling the corresponding latch to an input line.

24. The method of claim 23, wherein the memory cells are multi-state memory cells.

25. The method of claim 23, further comprising:
reading a memory portion on the integrated circuit, wherein said fusing out one or more of the shift registers is based on the contents of said memory portion.

26. The method of claim 23, further comprising:
asserting a control signal to the shift register when the strobe bit reaches the last stage of the shift register, wherein in response to the control signal the shift register advances the strobe bit from the last stage of the shift register to the preceding stages.

* * * * *